United States Patent
Kang et al.

(10) Patent No.: US 9,778,697 B2
(45) Date of Patent: *Oct. 3, 2017

(54) FLEXIBLE TOUCH SCREEN PANEL AND FLEXIBLE DISPLAY DEVICE WITH THE SAME

(71) Applicant: SAMSUNG DISPLAY CO., LTD., Yongin, Gyeonggi-Do (KR)

(72) Inventors: Sung-Ku Kang, Yongin (KR); Tae-Hyeog Jung, Yongin (KR); Hak-Sun Kim, Yongin (KR); Jung-Yun Kim, Yongin (KR); Mi-Ae Park, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 143 days.

This patent is subject to a terminal disclaimer.

(21) Appl. No.: 14/592,276

(22) Filed: Jan. 8, 2015

(65) Prior Publication Data

US 2015/0123926 A1 May 7, 2015

Related U.S. Application Data

(63) Continuation of application No. 13/888,574, filed on May 7, 2013, now Pat. No. 8,946,985.
(Continued)

(30) Foreign Application Priority Data

Feb. 5, 2013 (KR) ........................ 10-2013-0012887

(51) Int. Cl.
*G06F 1/16* (2006.01)
*H01H 1/10* (2006.01)
(Continued)

(52) U.S. Cl.
CPC .......... *G06F 1/1652* (2013.01); *G06F 1/1643* (2013.01); *G06F 3/044* (2013.01);
(Continued)

(58) Field of Classification Search
CPC ................ G06F 1/1643; G06F 1/1652; G06F 2203/04102; G06F 2203/04103;
(Continued)

(56) References Cited

U.S. PATENT DOCUMENTS 8,847,482 B2 * 9/2014 Fujii .................... H01L 51/0004
313/506
2001/0008433 A1 7/2001 Fujii et al.
(Continued)

FOREIGN PATENT DOCUMENTS

KR 10-2010-0090669 A 8/2010
KR 10-2011-0039182 A 4/2011
(Continued)

*Primary Examiner* — Dmitriy Bolotin
(74) *Attorney, Agent, or Firm* — Lee & Morse, P.C.

(57) ABSTRACT

A flexible touch screen panel includes a substrate having flexibility, sensing electrodes on at least one surface of the substrate, and implemented using an opaque conductive metal, and a polarizing plate on the substrate having the sensing electrodes formed thereon. The sensing electrodes may be implemented in a mesh shape having a plurality of openings.

20 Claims, 8 Drawing Sheets

Related U.S. Application Data

(60) Provisional application No. 61/643,566, filed on May 7, 2012.

(51) Int. Cl.
*H01L 27/32* (2006.01)
*G06F 3/044* (2006.01)
*G06F 3/041* (2006.01)

(52) U.S. Cl.
CPC ............. *G06F 3/0412* (2013.01); *H01H 1/10* (2013.01); *H01L 27/3225* (2013.01); *G06F 2203/04102* (2013.01); *G06F 2203/04103* (2013.01); *G06F 2203/04111* (2013.01)

(58) Field of Classification Search
CPC ......... G06F 2203/04111; G06F 3/0412; G06F 3/044; H01H 1/10; H01L 27/3225
USPC ................... 345/173; 313/511, 512; 200/278
See application file for complete search history.

(56) References Cited

U.S. PATENT DOCUMENTS

| | | | |
|---|---|---|---|
| 2004/0075779 A1 | 4/2004 | Paukshto et al. | |
| 2004/0239641 A1 | 12/2004 | Takahata et al. | |
| 2005/0212420 A1* | 9/2005 | Sakakura | H01L 27/3248 313/512 |
| 2011/0007011 A1* | 1/2011 | Mozdzyn | G06F 3/044 345/173 |
| 2012/0031746 A1 | 2/2012 | Hwang et al. | |
| 2012/0105081 A1* | 5/2012 | Shaikh | G06K 9/0002 324/686 |
| 2012/0182256 A1* | 7/2012 | Kitada | G06F 3/0416 345/174 |
| 2012/0299863 A1* | 11/2012 | Yilmaz | G06K 19/07758 345/174 |
| 2012/0306777 A1 | 12/2012 | Kang et al. | |
| 2013/0000959 A1* | 1/2013 | Park | G06F 3/044 174/257 |
| 2013/0047428 A1* | 2/2013 | Ra | G06F 3/041 29/846 |
| 2013/0106441 A1* | 5/2013 | Yilmaz | G06F 3/0414 324/658 |
| 2013/0127775 A1* | 5/2013 | Yilmaz | G06F 3/044 345/174 |
| 2013/0155001 A1* | 6/2013 | Yilmaz | G06F 3/044 345/174 |
| 2013/0180841 A1* | 7/2013 | Yilmaz | G06F 3/044 200/600 |
| 2013/0181910 A1 | 7/2013 | Yilmaz et al. | |
| 2013/0181911 A1* | 7/2013 | Yilmaz | G06F 3/044 345/173 |

FOREIGN PATENT DOCUMENTS

| | | |
|---|---|---|
| KR | 10-2012-0133848 A | 12/2012 |
| WO | WO 2010/057059 A1 | 5/2010 |
| WO | WO 2010/057659 A1 | 5/2010 |

\* cited by examiner

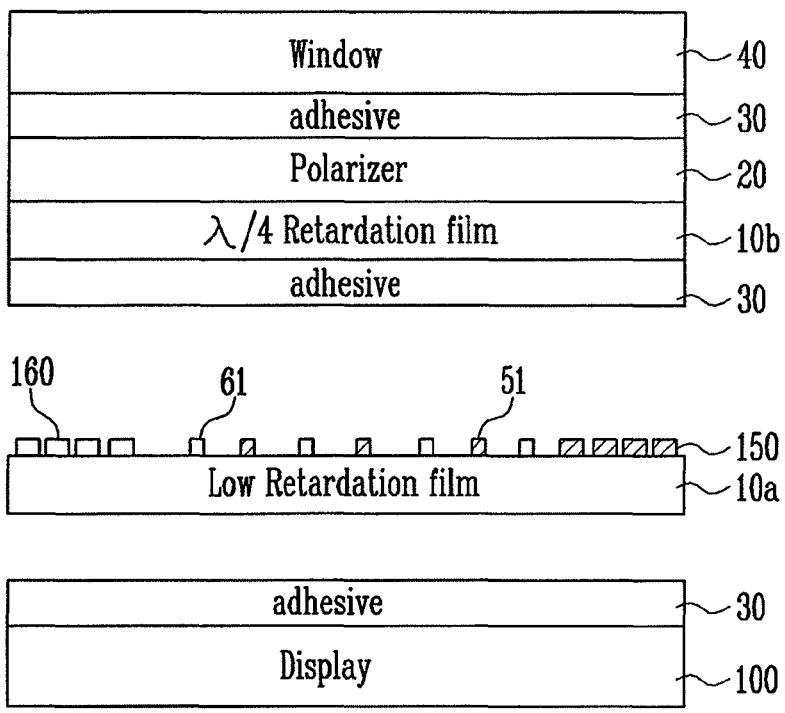
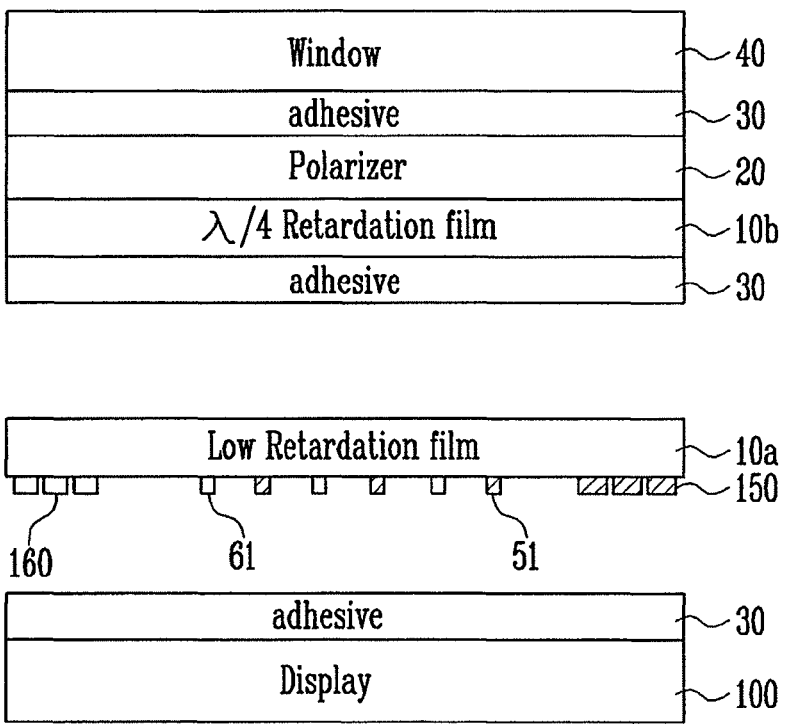

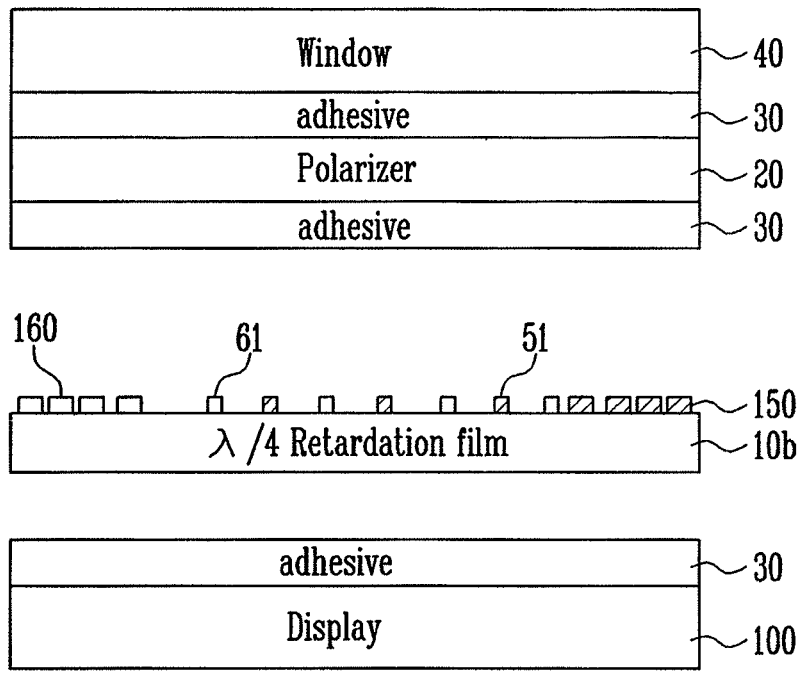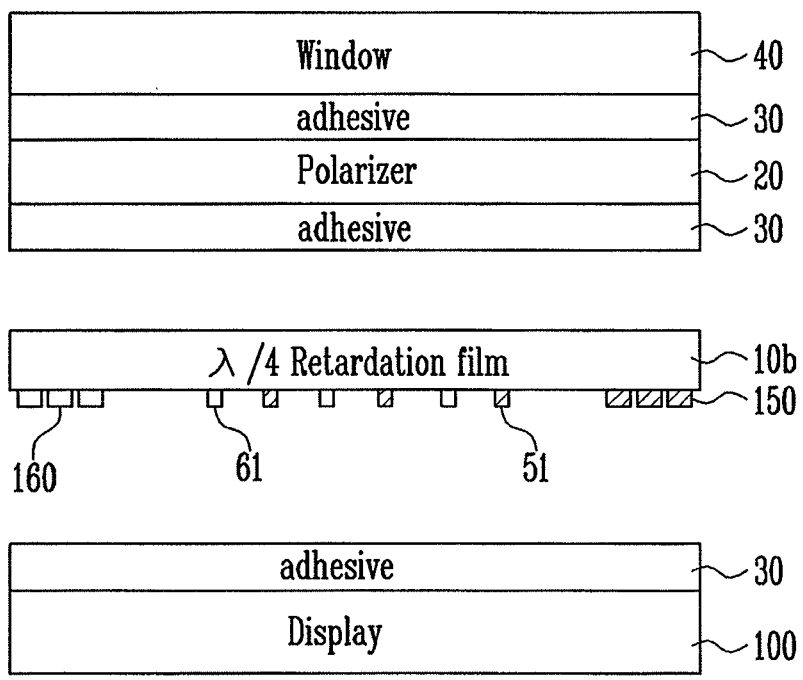

FLEXIBLE TOUCH SCREEN PANEL AND FLEXIBLE DISPLAY DEVICE WITH THE SAME

CROSS-REFERENCE TO RELATED APPLICATIONS

This is a continuation application based on pending application Ser. No. 13/888,574, filed May 7, 2013, which in turn claims priority under 35 U.S.C. §119(e) to U.S. Provisional Application No. 61/643,566, filed on May 7, 2012 and entitled "FLEXIBLE TOUCH SCREEN PANEL AND FLEXIBLE DISPLAY DEVICE WITH THE SAME," both of which are incorporated herein by reference in its entirety.

This application claims the benefit of and priority under 35 U.S.C. §119 to Korean Patent Application No. 10-2013-0012887, filed on Feb. 5, 2013, in the Korean Intellectual Property Office, and entitled: "FLEXIBLE TOUCH SCREEN PANEL AND FLEXIBLE DISPLAY DEVICE WITH THE SAME," which is incorporated by reference herein in its entirety.

BACKGROUND

1. Field

Embodiments relate to a flexible touch screen panel and a flexible display device with the same.

2. Description of the Related Art

A touch screen panel is an input device that allows a user's instruction to be input by selecting an instruction content displayed on a screen of a display device or the like with a user's hand or object. The touch screen panel may be formed on a front face of the display device to convert a contact position into an electrical signal. The user's hand or object may directly contact the touch screen panel at the contact position. Accordingly, the instruction content selected at the contact position may be input as an input signal to the image display device. Since such a touch screen panel may be substituted for a separate input device connected to a display device, such as a keyboard or mouse, its application fields have been gradually extended.

SUMMARY

Embodiments are directed to a flexible touch screen panel, including a substrate having flexibility, sensing electrodes on at least one surface of the substrate, and implemented using an opaque conductive metal, and a polarizing plate on the substrate having the sensing electrodes formed thereon. The sensing electrodes may be implemented in a mesh shape having a plurality of openings.

The sensing electrodes may be implemented with first sensing electrodes arranged in a first direction and second sensing electrodes arranged in a second direction intersecting the first direction.

The first sensing electrodes may be configured with a plurality of first sensing cells arranged along the first direction and first connection patterns connecting the first sensing cells to each other, and the second sensing electrodes are configured with a plurality of second sensing cells arranged along the second direction and second connection patterns connecting the second sensing cells to each other.

The first sensing electrodes and the second sensing electrodes may be on the same surface of the substrate.

An insulation layer may be interposed in at least one intersection portion between the first and second sensing electrodes.

The first sensing electrodes and the second sensing electrodes may be respectively on different surfaces of the substrate.

The opaque metal may be at least one low-resistance metal selected from the group of Ag, Al, Cu, Cr, and Ni, or a nano-metal conductive layer.

The polarizing plate may be implemented with a film made of a poly vinyl alcohol having flexibility.

The polarizing plate may be implemented with a coating-type polarizing layer.

The coating-type polarizing layer may be formed with a thin crystal film polarizer.

The substrate may be implemented with one of a non-stretched polycarbonate and a cyclic polyolefin, as a low retardation film having a low retardation value.

At least one retardation film may be between the substrate and the polarizing plate.

The retardation film may be a quarter-wave plate or half-wave plate.

The substrate may be implemented with one of a polycarbonate film, an oriented poly propylene film, and a poly vinyl alcohol film, which have a retardation function.

The substrate may be a quarter-wave plate.

A half-wave plate may be between the substrate and the polarizing plate.

Embodiments are also directed to a flexible display device with a flexible touch screen panel, including a substrate having flexibility, sensing electrodes on at least one surface of the substrate, and implemented using an opaque conductive metal, a polarizing plate on the substrate having the sensing electrodes thereon, and the flexible display device attached beneath the substrate. The sensing electrodes may be implemented in a mesh shape having a plurality of openings.

The flexible display device may be implemented as an organic light emitting display device.

A window substrate may be attached to an upper surface of the polarizing plate.

The window substrate may be formed of at least one of polymethyl methacrylate, acryl, and polyester.

BRIEF DESCRIPTION OF THE DRAWINGS

Features will become apparent to those of skill in the art by describing in detail example embodiments with reference to the attached drawings in which:

FIGS. 4A and 4B are sectional views showing a touch screen panel and a flexible display device with the same according to another example embodiment.

FIGS. 6A and 6B are sectional views showing a touch screen panel and a flexible display device with the same according to still another example embodiment.

DETAILED DESCRIPTION

Figure 1:
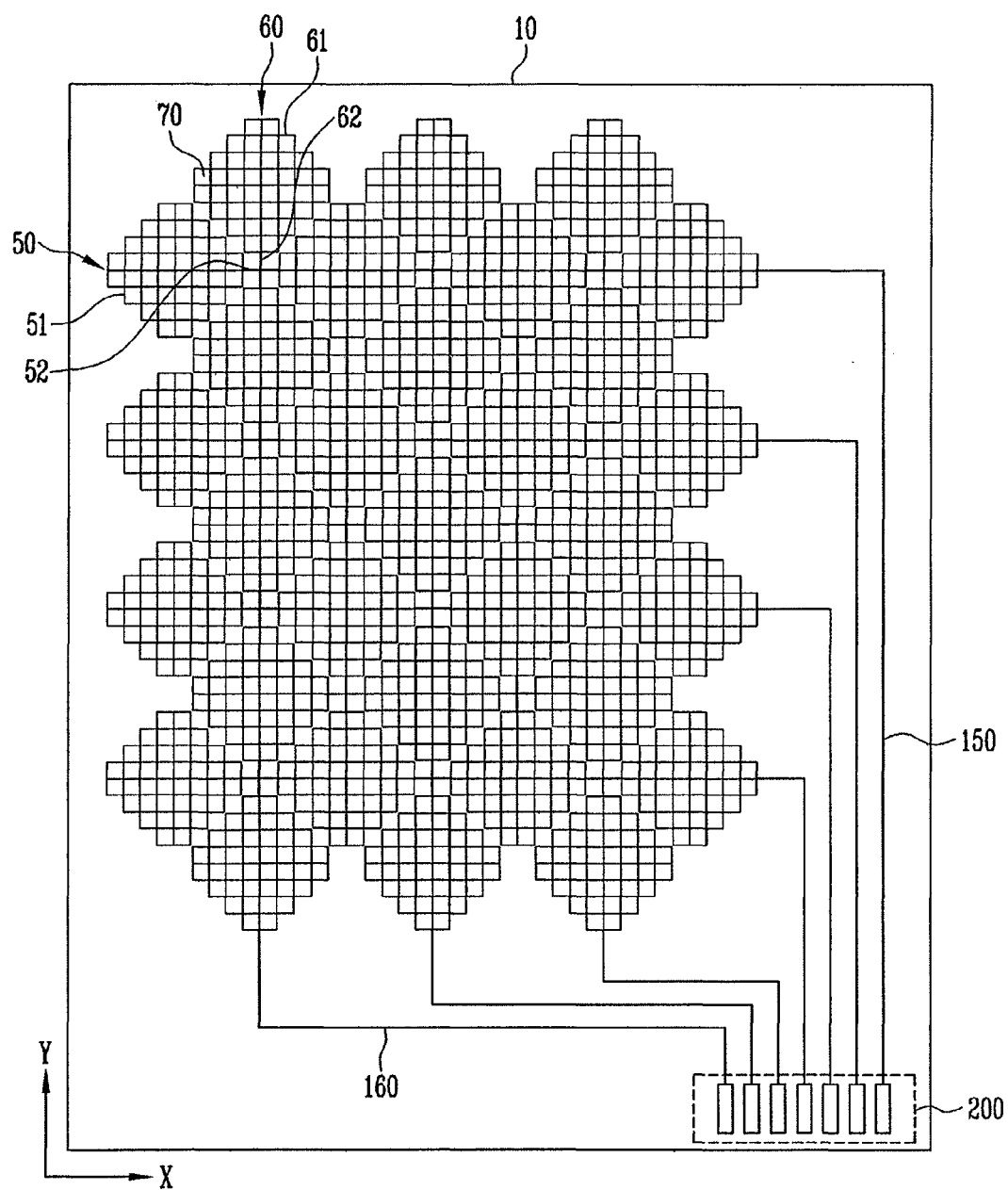
FIG. 1 is a plan view showing a touch screen panel according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it may be directly on the other element, or one or more intervening elements may also be present. It will also be understood that when an element is referred to as being "under" another element, it may be directly under, or one or more intervening elements may also be present. It will also be understood that when an element is referred to as being "between" two elements, it may be the only element between the two elements, or one or more intervening elements may also be present. Also, when an element is referred to as being "connected to" another element, it may be directly connected to the another element or be indirectly connected to the another element with one or more intervening elements interposed therebetween. Like reference numerals refer to like elements throughout.

Figure 2A:
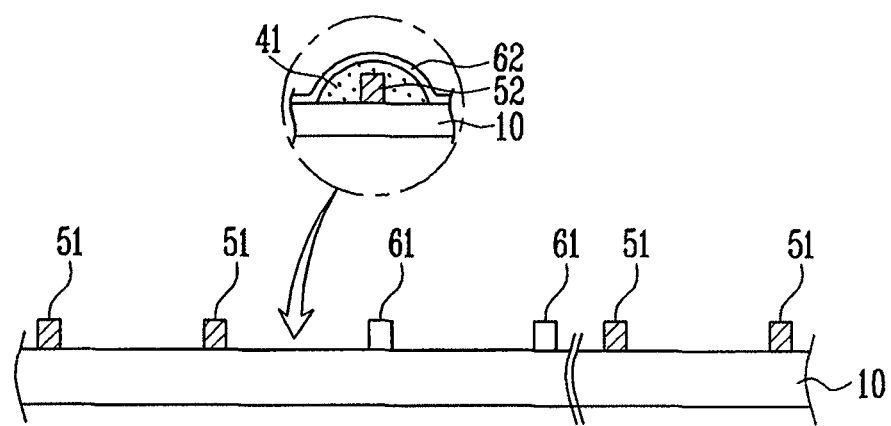
FIGS. 2A and 2B are sectional views of the touch screen panel shown in FIG. 1.
Figure 2B:
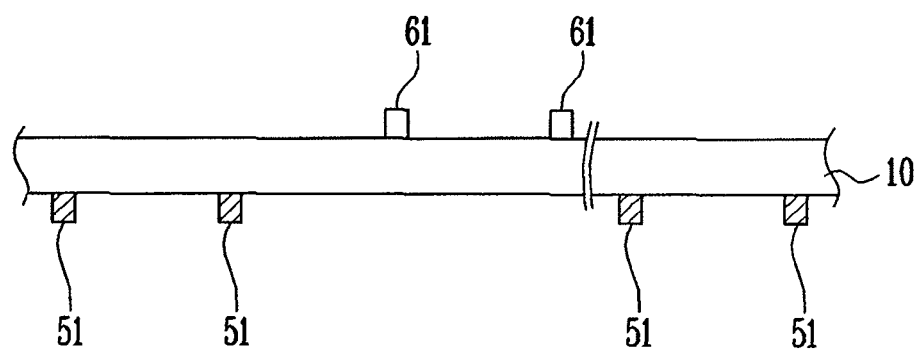

FIG. 1 is a plan view showing a touch screen panel according to an example embodiment. FIGS. 2A and 2B are sectional views of the touch screen panel shown in FIG. 1.

Referring to FIGS. 1 and 2, the touch screen panel according to the present example embodiment includes a substrate 10 having flexibility, first and second sensing electrodes 50 and 60 formed on at least one surface of the substrate 10, and first and second position detecting lines 150 and 160 connecting the respective first and second sensing electrodes 50 and 60 to an external touch driving circuit (not shown) through a pad portion 200.

As shown in FIG. 1, the first sensing electrode 50 is formed long in a first direction (e.g., an X-axis direction), and may be arranged in plural numbers along a second direction (e.g., a Y-axis direction) intersecting the first direction.

The second sensing electrode 60 is formed long in the second direction, and may be arranged in plural numbers along the first direction.

The sensing electrodes 50 and 60 according to the present example embodiment may be formed of a flexible opaque conductive material rather than a transparent conductive material (e.g., indium tin oxide (ITO)) in order to prevent an operation failure from being caused by a crack that occurs in the sensing electrode when the flexible touch screen panel is bent or folded. A low-resistance metal as an opaque metal, such as Ag, Al, Cu, Cr, or Ni, or a nano-metal conductive layer such as a silver nano-wire (AgNW) may be used as the conductive material of the sensing electrodes 50 and 60. However, the present example embodiment is not limited thereto.

ITO may have insufficient flexibility when used for sensing electrodes and cracks may occur when the ITO is applied to the flexible touch screen panel. However, in the present example embodiment the opaque metal is used as the sensing electrodes, and the occurrence of cracks may be decreased as compared with the ITO, and thus the opaque metal may be easily applied to the flexible touch screen panel. Where the sensing electrodes 50 and 60 are formed of metal having a relatively lower resistance than the ITO, RC delay is also reduced.

Where the sensing electrodes 50 and 60 are formed of the opaque metal, the metal reflection gloss and surface reflectivity of the opaque metal may be increased so that a user can view the sensing electrodes 50 and 60. Therefore, it may be difficult to implement a high-quality product. Thus, in the present example embodiment, a polarizing plate having flexibility is formed on the substrate 10 having the sensing electrodes 50 and 60 formed thereon, so that the metal reflection gloss may be removed and the surface reflectivity may be decreased, thereby reducing the visibility of the sensing electrodes.

In the present example embodiment, the substrate 10 having the sensing electrodes formed thereon is a low retardation film that is positioned below the polarizing plate and has a flexible material. The substrate 10 may be implemented with a non-stretched polycarbonate (PC) film, cyclic polyolefin (COP) film, etc.

In another implementation, the substrate 10 may perform the function of a retardation film provided in the polarizing plate. In the present example embodiment, the substrate 10 may be implemented with a PC, oriented poly propylene (OPP), or poly vinyl alcohol (PVA) film.

The structure of the present example embodiment as described above may be implemented as various example embodiments, and will be described in detail with reference to FIGS. 3 to 8.

In the present example embodiment, as shown in FIG. 1, the sensing electrodes 50 and 60 are formed in a mesh shape so that the opaque conductive material is used as the sensing electrode. Referring to FIG. 1, the first sensing electrode 50 may be configured with a first sensing cells 51 arranged in plural numbers in the first direction and a first connection pattern 52 electrically connecting the first sensing cells 51 to each other. The second sensing electrode 60 may be configured with a second sensing cell 61 arranged in plural numbers in the second direction and a second connection pattern 62 electrically connecting the second sensing cells 61 to each other.

A plurality of openings 70 are formed in the first sensing cell 51, the second sensing cell 61, the first connection pattern 52, and the second connection pattern 62, and accordingly, the mesh-shaped sensing electrode may be implemented.

In the present example embodiment, the first and second sensing cells 51 and 61 may have a rhombic shape, but the shape of the sensing cell according to the present example embodiment is not limited thereto.

A display device in which a plurality of pixels are regularly arranged to display an image is disposed beneath the substrate 10 having the sensing cells formed thereon. In a case where the shape and arrangement of the sensing cells have regularity, a Moiré phenomenon may occur due to interference between the pixels in the display device, and therefore, the display quality of the display device may be degraded. Thus, the frames of the sensing cells 51 and 61 may be implemented in the shape of a random curve.

In the present example embodiment, for convenience of illustration, a case where the sensing cells 51 and 61 are implemented in the same rhombic shape as shown in FIG. 1 will be described as an example.

The first position detecting line 150 is connected to one end of the first sensing electrode 50, and the second position detecting line 160 is connected to one end of the second sensing electrode 60. The first and second position detecting lines 150 and 160 may transmit signals detected from the respective sensing electrodes 50 and 60 to the touch driving circuit (not shown) through the pad portion 200. Thus, the touch driving circuit receiving the signals transmitted from the first and second position detecting lines 150 and 160 may detect a user's touch position.

In the present example embodiment, the first position detecting line 150 may be formed of the same material as the first sensing electrode 50 connected thereto, and the second position detecting line 160 may be formed of the same material as the second sensing electrode 60 connected thereto. Thus, the position detecting line 150 or 160 may be formed with the sensing electrode 50 or 60 through the same process, thereby further simplifying the process.

In the present example embodiment, the first and second sensing electrodes 50 and 60 may be formed together on the same surface of the substrate, or may be formed on both surfaces of the substrate 10, respectively.

First, referring to FIG. 2A, there is shown a structure in which the first and second sensing electrodes 50 and 60 are formed together on the same surface of the substrate 10. In the present example embodiment, the portion at which the first and second sensing electrodes 50 and 60 intersect each other is insulated, and an insulation layer 41 may be interposed in the intersection portion between the first and second sensing electrodes 50 and 60.

The first and second sensing electrodes 50 and 60 intersect each other between the first and second connection patterns 52 and 62. Therefore, as shown in the enlarged section of FIG. 2A, the insulation layer 41 may exist between the first and second connection patterns 52 and 62. In the present example embodiment, the insulation layer 41 may be partially formed at the intersection portion of the first and second sensing electrodes 50 and 60.

Next, referring to FIG. 2B, there is shown a structure in which the first and second sensing electrodes 50 and 60 are formed on both the surfaces of the substrate 10, respectively. As shown in FIG. 2B, the substrate 10 performs the function of an insulation layer. Therefore, the first sensing cells 51 and the first connection patterns 52, constituting the first sensing electrode 50, may be formed on a first surface of the substrate 10, and the second sensing cells 61 and the second connection patterns 62, constituting the second sensing electrode 60, may be formed on a second surface of the substrate 10. In the present example embodiment, a separate insulation layer (as shown in FIG. 2A) may be omitted to simplify the process.

FIGS. 3 to 8 are sectional views showing touch screen panels to which the structure of the touch screen panel described with reference to FIGS. 1 and 2 and flexible display devices with the touch screen panels according to various example embodiments may be applied. Hereinafter, a stacked structure of an example embodiment corresponding to each figure will be described in detail.

Figure 3A:
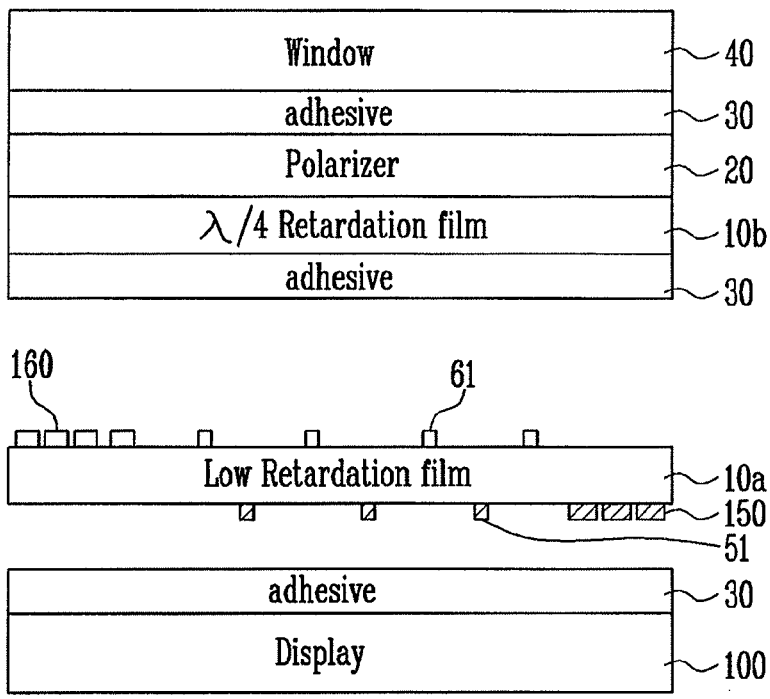
FIGS. 3A and 3B are sectional views showing a touch screen panel and a flexible display device with the same according to an example embodiment.

First, in the example embodiment shown in FIG. 3A, like the example embodiment of FIG. 2B, first sensing cells 51 and first connection patterns 52, constituting first sensing electrodes 50, and first position detecting lines 150 connected to the first sensing electrodes 50 are formed on a first surface of a substrate 10a, and second sensing cells 61 and second connection patterns 62, constituting second sensing electrodes 60, and second position detecting lines 160 connected to the second sensing electrodes 60 are formed on a second surface of the substrate 10a.

However, for convenience of illustration, only the first sensing cells 51 and the first position detecting lines 150, formed on the first surface of the substrate 10a and only the second sensing cells 61 and the second position detecting lines 160, formed on the second surface of the substrate 10a are shown in FIG. 3A.

A polarizing plate 20 performing a polarizing function, a window substrate 40 attached to the top of the polarizing plate 20, and a retardation film 10b attached to the bottom of the polarizing plate 20 are provided above the substrate 10a having the sensing electrodes formed thereon. A flexible display device 100 is provided below the substrate 10a.

In the present example embodiment, the components are attached to each other by a transparent adhesive layer 30. In FIG. 3A, it has been illustrated that the substrate 10a having the sensing electrodes formed thereon is separated. However, this is for the purpose that the position of the sensing cell or the like is clearly illustrated. Thus, the substrate 10a is attached to the components by the transparent adhesive layers 30 respectively formed on the top and bottom of the substrate 10a.

The display device 100 is a display device having flexibility, and may be implemented as an organic light emitting display device. For example, unlike a liquid crystal display device, the organic light emitting display device as a self-luminescent device does not require a backlight unit. A substrate is formed of, e.g., polymethyl methacrylate (PMMA), acryl, polyester (PET) or the like, which has flexibility. Thus, the organic light emitting display device can have flexibility.

The transparent adhesive layer 30 is a transparent adhesive material having high light transmittance. The transparent adhesive layer 30 may be made of super view resin (SVR) or optically clear adhesive (OCA).

The polarizing plate 20 has flexibility.

A general polarizing plate may be implemented in a structure in which a polarizer is interposed between upper and lower support layers. The polarizer performs a function of controlling the amount of transmitted light according to the polarized degree of incident light. The polarizer may be implemented with a film made of a PVA material. For example, the polarizer implements polarization by stretching a PVA film having iodine absorbed therein with strong tension. The support layers respectively provided on the upper and lower surfaces of the polarizer may be implemented with a film made of a triacetyl cellulose (TAC) material for protecting and supporting the PVA film. However, in the general polarizing plate having the stacked structure, the polarizer has a thickness of, e.g., about 20 μm, and each of the upper and lower support layers has a thickness of, e.g., about 80 μm. Therefore, the polarizing plate entirely has a great thickness of, e.g., about 180 μm.

TAC (a material of the general support layer) has high elasticity. Therefore, if the polarizing plate having the support layers is attached to the flexible touch screen panel, it may not be possible to secure the bending characteristic of the flexible touch screen panel. Accordingly, in the present example embodiment, the polarizing plate 20 is implemented by removing at least one support layer (relative to the general polarizing plate) and forming the support layer using a material with flexibility, or is implemented by forming a coating-type polarizing layer on the flexible support layer.

In the present example embodiment, the coating-type polarizing layer may be formed in various structures and manners. For example, the coating-type polarizing layer may be formed with a thin crystal film polarizer.

The retardation film 10b is attached beneath the polarizing plate 20. The retardation film 10b performs a function of providing a temporal phase shift (retardation) to light polarized by the polarizing plate 20 so that incident light is converted into circularly polarized light or almost circularly polarized light through left or right circular polarization.

In the example embodiment of FIG. 3A, the retardation film 10b is a quarter-wave plate (QWP) having a retardation function. For example, the retardation film 10b may be implemented as a PC, OPP, or PVA film.

In the present example embodiment, the retardation film may be implemented in the stacked structure of a plurality of retardation films having different retardation values in order to secure the optimal black characteristic for light transmitted through the polarizing plate 20.

Figure 3B:
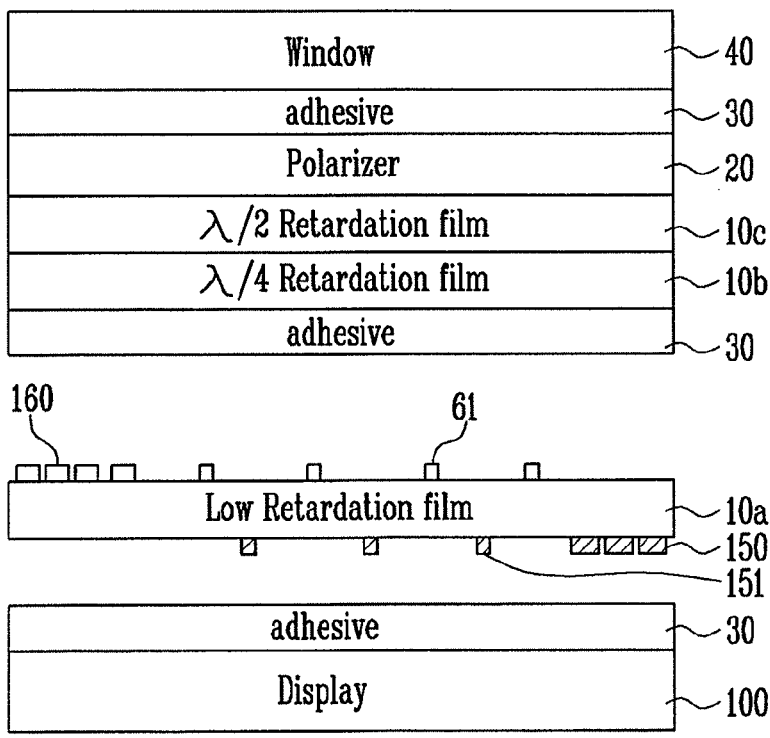

Thus, when comparing the example embodiment of FIG. 3B with the example embodiment of FIG. 3A, the example embodiment of FIG. 3B has a structure in which a retardation film 10c as a half-wave plate (HWP) is further provided on the retardation film 10b as the QWP. In the example embodiment of FIG. 3B, the structure is identical to that of FIG. 3A, except that the HWP is further provided, and therefore details thereof will not be repeated.

In the example embodiment of FIGS. 3A and 3B, one or more retardation films 10b and 10c are provided to the lower surface of the polarizing plate 20. Therefore, the substrate 10a on which the sensing cells 51 and 61, etc., are formed may be implemented with a non-stretched polycarbonate (PC) film, cyclic polyolefin (COP) film, etc., as a low retardation film having flexibility and very low retardation value (about 20 nm or less).

Since the display device 20 and the touch screen panel have flexibility, the window substrate 40 attached to the upper surface of the polarizing plate 10 for the purpose of strength improvement may be implemented using a material with flexibility. Therefore, in the present example embodiment, the window substrate 40 may be made of PMMA, acryl, PET, etc., and the thickness of the window substrate 40 may be about 0.7 mm.

Next, in the example embodiments shown in FIGS. 4A and 4B, like the example embodiment of FIG. 2A, the sensing electrodes 50 and 60 are formed on the same surface of the substrate 10a. The stacked structure of the other components is identical to that in the example embodiment of FIG. 3A, and therefore details thereof will not be repeated.

Thus, the example embodiment of FIG. 4A has a structure in which the first and second sensing cells 51 and 61 constituting the respective first and second sensing electrodes 50 and 60, and the first and second position detecting lines 150 and 160 connected to the respective first and second sensing electrodes 50 and 60 are formed on a second surface that is an upper surface of the substrate 10a.

The example embodiment of FIG. 4B has a structure in which the first and second sensing cells 51 and 61 constituting the respective first and second sensing electrodes 50 and 60, and the first and second position detecting lines 150 and 160 connected to the respective first and second sensing electrodes 50 and 60 are formed on a first surface that is a lower surface of the substrate 10a.

Although it has been illustrated in the example embodiment of FIGS. 4A and 4B that only one retardation film 10b is provided, the retardation film 10b may be implemented in the stacked structure of a plurality of retardation films having different retardation values as shown in FIG. 3B.

Figure 5:
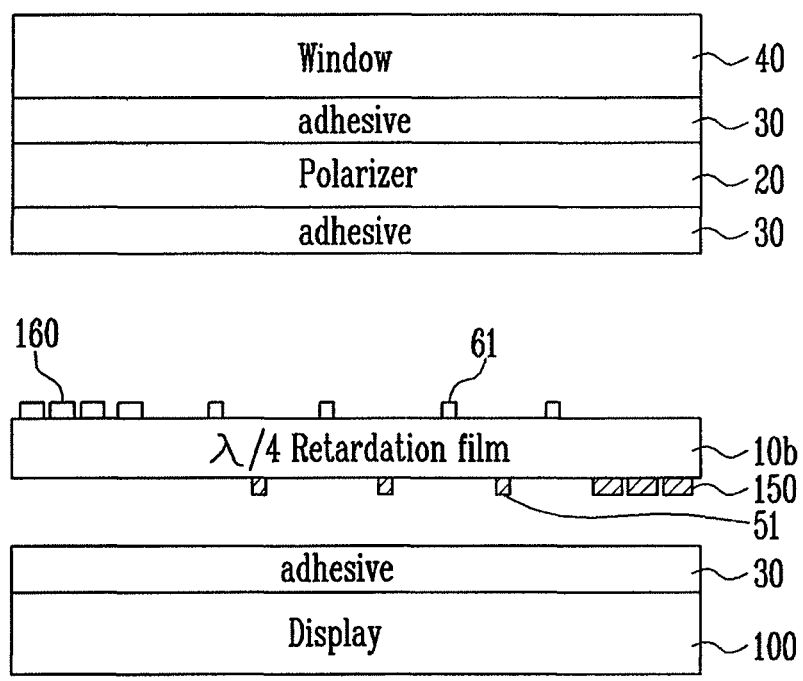
FIG. 5 is a sectional view showing a touch screen panel and a flexible display device with the same according to still another example embodiment.

Next, when comparing the example embodiment shown in FIG. 5 with the example embodiment of FIG. 3A, the example embodiment of FIG. 5 is different the example embodiment of FIG. 3A in that the substrate 10b having sensing electrodes formed thereon is implemented with a retardation film 10b disposed below the polarizing plate 20, rather than the low retardation film having very low retardation value (about 20 nm or less).

Thus, the example embodiment of FIG. 5 has a structure in which the first sensing cells 51 and the first connection patterns 52, constituting the first sensing electrodes 50, and the first position detecting lines 150 connected to the first sensing electrodes 50 are formed on a first surface of the retardation film 10b, and the second censing cells 61 and the second connection patterns 62, constituting the second sensing electrodes 60, and the second position detecting lines 160 connected to the second sensing electrodes 60 are formed on a second surface of the retardation film 10b.

Thus, in the example embodiment of FIG. 5, it is possible to remove the substrate provided in the example embodiment of FIG. 3A, i.e., the substrate 10a implemented with the low retardation film having very low retardation value (about 20 nm or less), to thereby implement an ultra-thin flexible touch screen panel.

In the present example embodiment, the retardation film 10b as the substrate on which the sensing cells 51 and 61, etc., are formed may be implemented with a PC, OPP or PVA film having a retardation function.

Among the components constituting the example embodiment of FIG. 5, components identical to those in the example embodiment of FIG. 3 are designated by like reference numerals, and details thereof will not be repeated.

In the example embodiments of FIGS. 6A and 6B, like the example embodiment of FIG. 5, the sensing electrodes 50 and 60 are formed on the same surface of a substrate 10b as a retardation film. The stacked structure of the other components is identical to that in the example embodiment of FIG. 5, and therefore details thereof will not be repeated.

Thus, the example embodiment of FIG. 6A has a structure in which the first and second sensing cells 51 and 61 constituting the respective first and second sensing electrodes 50 and 60, and the first and second position detecting lines 150 and 160 connected to the respective first and second sensing electrodes 50 and 60 are formed on a second surface that is an upper surface of the substrate 10b.

The example embodiment of FIG. 6B has a structure in which the first and second sensing cells 51 and 61 constituting the respective first and second sensing electrodes 50 and 60, and the first and second position detecting lines 150 and 160 connected to the respective first and second sensing electrodes 50 and 60 are formed on a first surface that is a lower surface of the substrate 10b.

Figure 7:
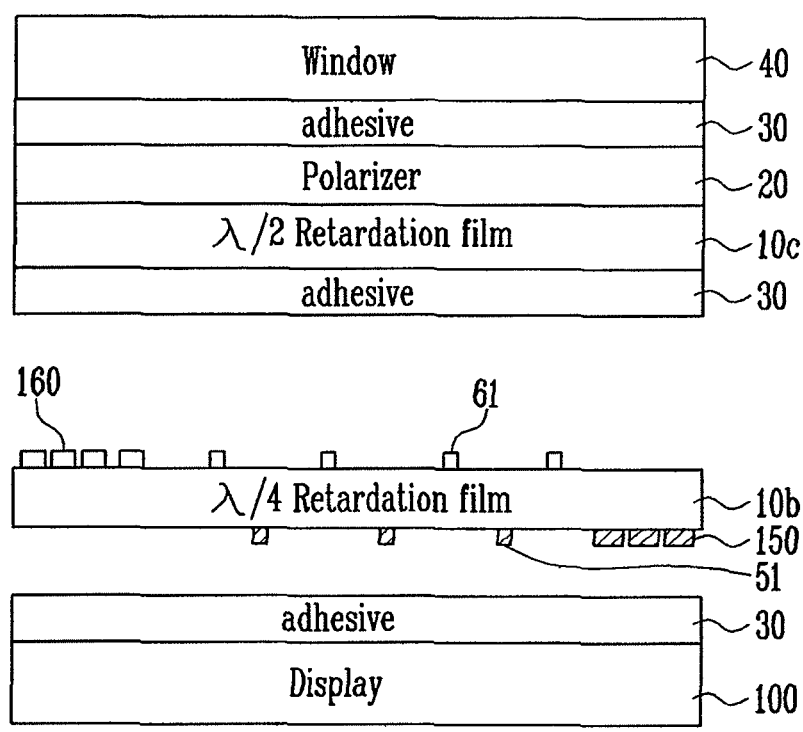
FIG. 7 is a sectional view showing a touch screen panel and a flexible display device with the same according to still another example embodiment.

Next, when comparing the example embodiment shown in FIG. 7 with the example embodiment of FIG. 5, the example embodiment of FIG. 7 is different the example embodiment of FIG. 5 in that a second retardation film 10c having a retardation value different from that of a first retardation film 10b having sensing electrodes formed thereon is further provided between the first retardation film 10b and the polarizing plate 20.

Thus, if the first retardation film 10b is a QWP having a retardation function as an example, the second retardation film 10c as an HWP is further provided between the first retardation film 10 and the polarizing plate 20 in order to secure the optimal black characteristic for light transmitted through the polarizing plate 20.

Among the components constituting the example embodiment of FIG. 7, components identical to those in the example embodiment of FIG. 5 are designated by like reference numerals, and therefore details thereof will not be repeated.

Figure 8A:
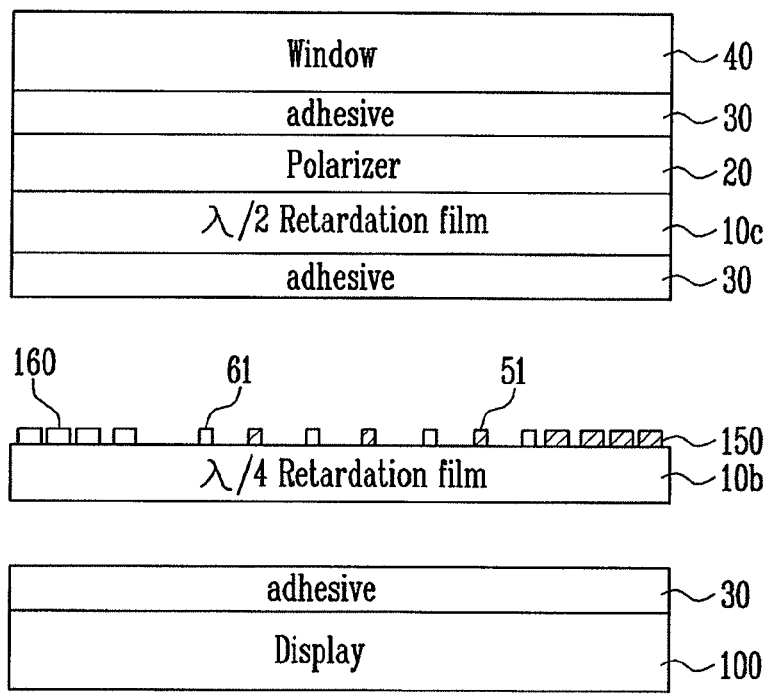
FIGS. 8A and 8B are sectional views showing a touch screen panel and a flexible display device with the same according to still another example embodiment.
Figure 8B:
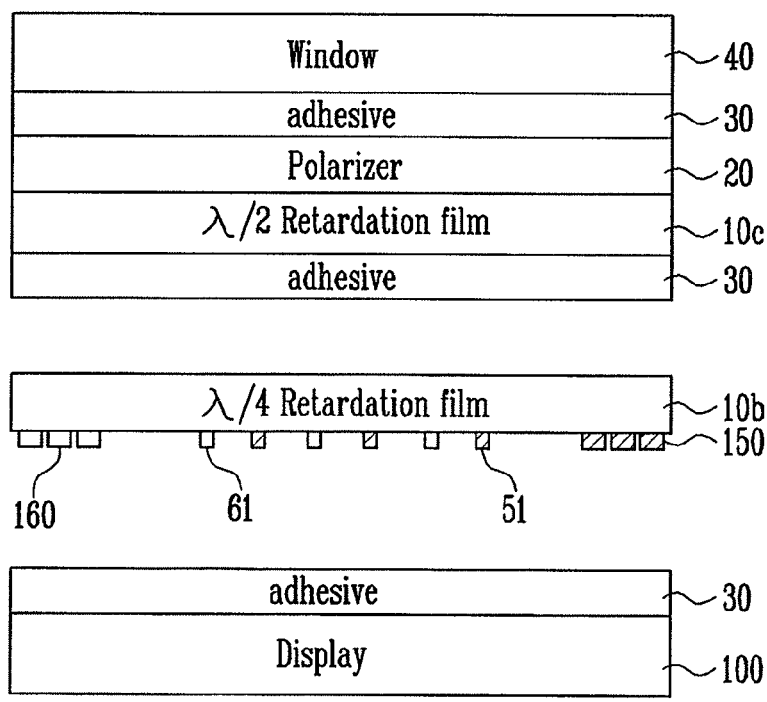

In the example embodiments of FIGS. 8A and 8B, like the example embodiment of FIG. 7, the sensing electrodes 50 and 60 are formed on the same surface of the substrate 10b as the first retardation film. The stacked structure of the other components is identical to that in the example embodiment of FIG. 7, and therefore details thereof will not be repeated.

Thus, the example embodiment of FIG. 8A has a structure in which the first and second sensing cells 51 and 61 constituting the respective first and second sensing electrodes 50 and 60, and the first and second position detecting lines 150 and 160 connected to the respective first and second sensing electrodes 50 and 60 are formed on a second surface that is an upper surface of the first retardation film 10b.

The example embodiment of FIG. 8B has a structure in which the first and second sensing cells 51 and 61 constituting the respective first and second sensing electrodes 50 and 60, and the first and second position detecting lines 150 and 160 connected to the respective first and second sensing electrodes 50 and 60 are formed on a first surface that is a lower surface of the first retardation film 10b.

By way of summation and review, touch screen panels may be divided into a resistive overlay touch screen panel, a photosensitive touch screen panel, a capacitive touch screen panel, and the like. Among these touch screen panels, the capacitive touch screen panel converts a contact position into an electrical signal by sensing a change in capacitance formed between a conductive sensing electrode and an adjacent sensing electrode or ground electrode when a user's hand or object comes in contact with the touch screen panel. Generally, such a touch screen panel is frequently commercialized by being attached to an outer face of a flat panel display such as a liquid crystal display or organic light emitting display. Therefore, the touch screen panel requires characteristics of high transparency and thin thickness. A flexible display device has recently been developed, and a touch screen panel attached on the flexible display device also requires flexibility.

In a general touch screen panel, the sensing electrodes may be implemented using a transparent conductive material such as indium tin oxide (ITO). However, when the flexible touch screen panel is bent or folded, cracks may occur in the sensing electrodes, and therefore, an operation failure may be caused. In a general touch screen panel, a thin-film growth process, a pattern formation process, and the like may be used for forming the sensing electrodes and the like, and therefore, characteristics such as high thermal resistance and chemical resistance may be required. Accordingly, the sensing electrodes and the like may be formed on a glass substrate in view of the process characteristics. However, the glass substrate should have a thickness with a certain value or more so as to be carried during processes. Therefore, the glass substrate may not be sufficiently thin or flexible.

As described above, embodiments may provide a flexible touch screen panel in which sensing electrodes as touch sensors are formed in the shape of a flexible conductive mesh on at least one surface of a substrate having flexibility. Thus, it may be possible to secure the flexibility of the flexible touch screen panel and to decrease the thickness of the flexible touch screen panel. Embodiments may also provide a flexible touch screen panel in which a polarizing plate having flexibility is formed on the substrate having the sensing electrodes formed thereon. Thus, it may be possible to reduce visibility of the sensing electrodes. Embodiments may also provide a flexible display device with the flexible touch screen panel.

As described above, according to embodiments, sensing electrodes as touch sensors may be formed in the shape of a flexible conductive mesh on at least one surface of a substrate having flexibility. Thus, it may be possible to secure the flexibility of the flexible touch screen panel and to decrease the thickness of the flexible touch screen panel. Further, a polarizing plate having flexibility may be formed on the substrate having the sensing electrodes formed thereon. Thus, it may be possible to reduce visibility of the sensing electrodes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible touch screen panel, comprising:
    a substrate having flexibility;
    sensing electrodes on at least one surface of the substrate, and including an opaque conductive material;
    position detecting lines connected to the sensing electrodes;
    a polarizing plate on the substrate; and
    an adhesive layer between the polarizing plate and the substrate,
    wherein the sensing electrodes are implemented in a mesh shape having a plurality of openings.

2. The flexible touch screen panel as claimed in claim 1, wherein the sensing electrodes include first sensing electrodes arranged in a first direction and second sensing electrodes arranged in a second direction intersecting the first direction.

3. The flexible touch screen panel as claimed in claim 2, wherein the first sensing electrodes include a plurality of first sensing cells arranged along the first direction and first connection patterns connecting the first sensing cells to each other, and the second sensing electrodes include a plurality of second sensing cells arranged along the second direction and second connection patterns connecting the second sensing cells to each other.

4. The flexible touch screen panel as claimed in claim 2, wherein the first sensing electrodes and the second sensing electrodes are on the same surface of the substrate.

5. The flexible touch screen panel as claimed in claim 4, wherein an insulation layer is interposed in at least one intersection portion between the first and second sensing electrodes.

6. The flexible touch screen panel as claimed in claim 2, wherein the first sensing electrodes and the second sensing electrodes are respectively on different surfaces of the substrate.

7. The flexible touch screen panel as claimed in claim 1, wherein the opaque conductive material is at least one metal selected from the group of Ag, Al, Cu, Cr, and Ni, or a nano-metal conductive layer.

8. The flexible touch screen panel as claimed in claim 1, wherein the polarizing plate includes a film made of a poly vinyl alcohol having flexibility.

9. The flexible touch screen panel as claimed in claim 1, wherein the polarizing plate includes a coating-type polarizing layer.

10. The flexible touch screen panel as claimed in claim 9, wherein the coating-type polarizing layer is formed with a thin crystal film polarizer.

11. The flexible touch screen panel as claimed in claim 1, wherein the substrate includes at least one of a non-stretched polycarbonate and a cyclic polyolefin.

12. The flexible touch screen panel as claimed in claim 11, wherein at least one retardation film is between the substrate and the polarizing plate.

13. The flexible touch screen panel as claimed in claim 12, wherein the retardation film is a quarter-wave plate or half-wave plate.

14. The flexible touch screen panel as claimed in claim 1, wherein the substrate includes at least one of a polycarbonate film, an oriented poly propylene film, and a poly vinyl alcohol film.

15. The flexible touch screen panel as claimed in claim 14, wherein the substrate is a quarter-wave plate.

16. The flexible touch screen panel as claimed in claim 15, wherein a half-wave plate is between the substrate and the polarizing plate.

17. A flexible display device with a flexible touch screen panel, comprising:
   a substrate having flexibility;
   sensing electrodes on at least one surface of the substrate, and including an opaque conductive material;
   position detecting lines connected to the sensing electrodes;
   a polarizing plate on the substrate;
   the flexible display device attached beneath the substrate;
   a first adhesive layer between the polarizing plate and the substrate; and
   a second adhesive layer between the substrate and the flexible display device,
   wherein the sensing electrodes are implemented in a mesh shape having a plurality of openings.

18. The flexible display device of claim 17, wherein the flexible display device is implemented as an organic light emitting display device.

19. The flexible display device of claim 17, wherein a window substrate is attached to an upper surface of the polarizing plate.

20. The flexible display device of claim 19, wherein the window substrate is formed of at least one of polymethyl methacrylate, acryl, and polyester.

* * * * *